United States Patent [19]

Lee

[11] Patent Number: 4,620,215
[45] Date of Patent: Oct. 28, 1986

[54] INTEGRATED CIRCUIT PACKAGING SYSTEMS WITH DOUBLE SURFACE HEAT DISSIPATION

[75] Inventor: James C. K. Lee, Los Altos Hills, Calif.

[73] Assignee: Amdahl Corporation, Sunnyvale, Calif.

[21] Appl. No.: 786,229

[22] Filed: Oct. 9, 1985

Related U.S. Application Data

[63] Continuation of Ser. No. 368,957, Apr. 16, 1982, abandoned.

[51] Int. Cl.[4] .................... H01L 23/36; H01L 23/14; H01L 23/54
[52] U.S. Cl. ........................................ 357/81; 357/71; 357/67
[58] Field of Search ................ 357/81, 71, 82, 74, 357/67; 174/16 HS

[56] References Cited

U.S. PATENT DOCUMENTS

| | | | |
|---|---|---|---|
| 3,476,986 | 11/1969 | Tsuji | 357/81 |
| 3,626,259 | 12/1971 | Torrance et al. | 357/81 |
| 3,651,562 | 3/1972 | Hambleton | 357/71 |
| 3,808,041 | 4/1974 | Rosenberger et al. | 357/71 |
| 4,109,297 | 8/1978 | Lesh et al. | 357/71 |
| 4,141,135 | 2/1979 | Henry et al. | 357/71 |
| 4,142,202 | 2/1979 | Csillag et al. | 357/71 |
| 4,278,991 | 7/1981 | Ritchie et al. | 357/81 |
| 4,372,809 | 2/1983 | Grewal et al. | 357/71 |
| 4,459,607 | 7/1984 | Reid | 357/71 |

FOREIGN PATENT DOCUMENTS

WO79/00578 8/1979 PCT Int'l Appl.
1052449 12/1966 United Kingdom.

OTHER PUBLICATIONS

"Structure for Achieving Thermal Enhancement in a Semiconductor Package"-Miller-IBM Corp. Technical Disclosure Bulletin, vol. 23, No. 6, Nov. 1980, p. 2308.
"Microcircuit Heat Sink-Cherniak et al.-IBM Technical Disclosure Bulletin"-vol. 8, No. 10, Mar. 1966, p. 1457.

Primary Examiner—Andrew J. James
Assistant Examiner—S. V. Clark
Attorney, Agent, or Firm—Fliesler, Dubb, Meyer & Lovejoy

[57] ABSTRACT

A mounting arrangement for a semiconductor integrated circuit chip having a first heat sink mounted to the bottom surface of the chip in good heat transfer relation and a second heat sink mounted to a region of the top surface of the chip interior to the bonding pads.

16 Claims, 12 Drawing Figures

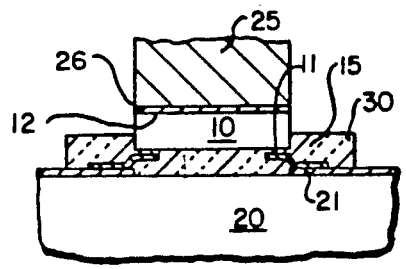
FIG.—1  PRIOR ART
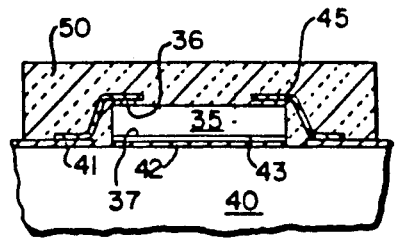
FIG.—2  PRIOR ART
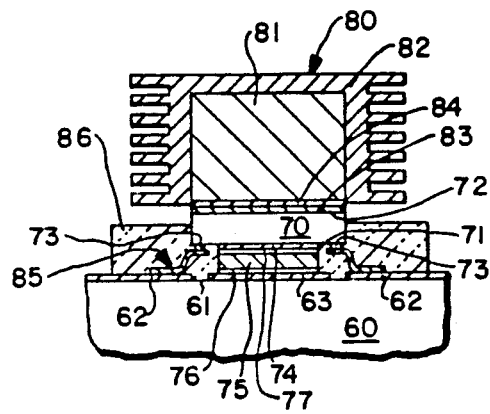
FIG.—3
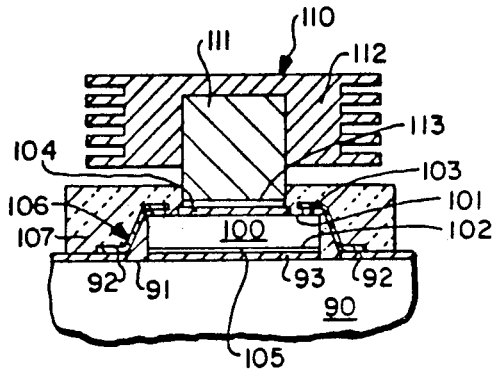
FIG—4
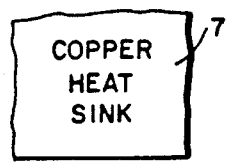
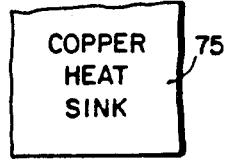
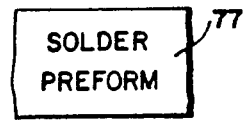
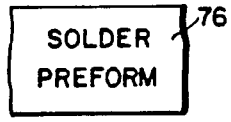
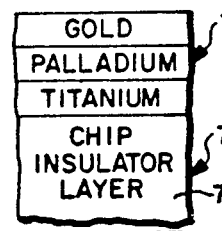
FIG.—7  FIG.—8
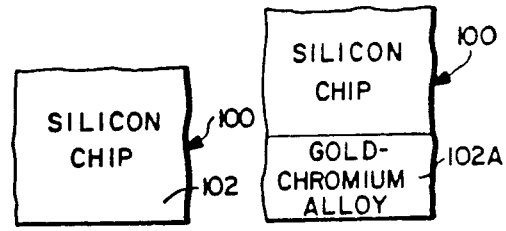
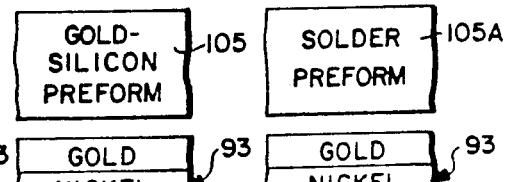
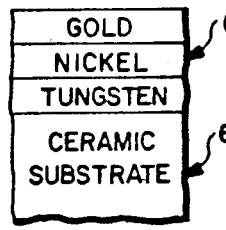
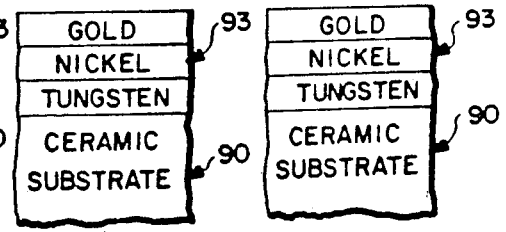
FIG.—9  FIG.—10

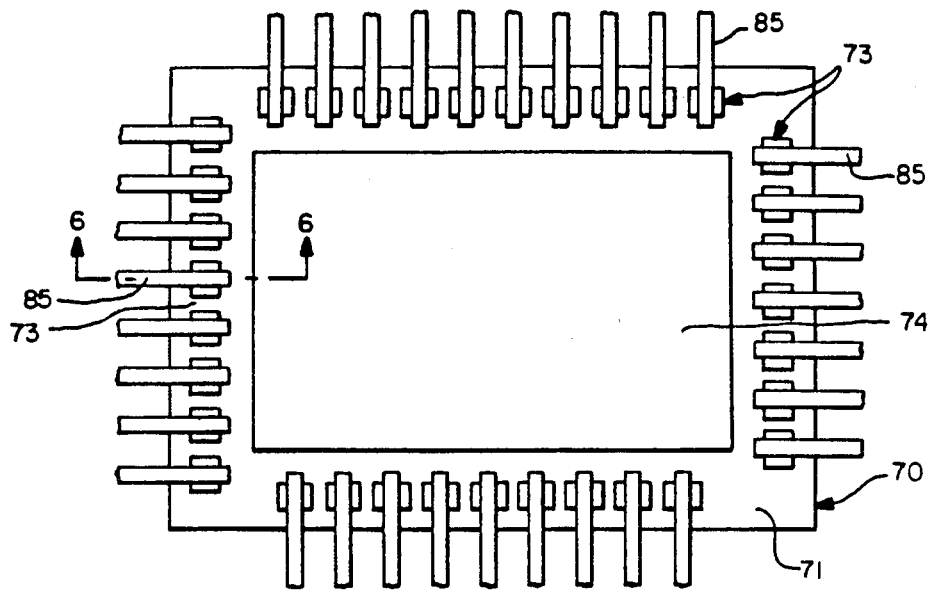
FIG.—5
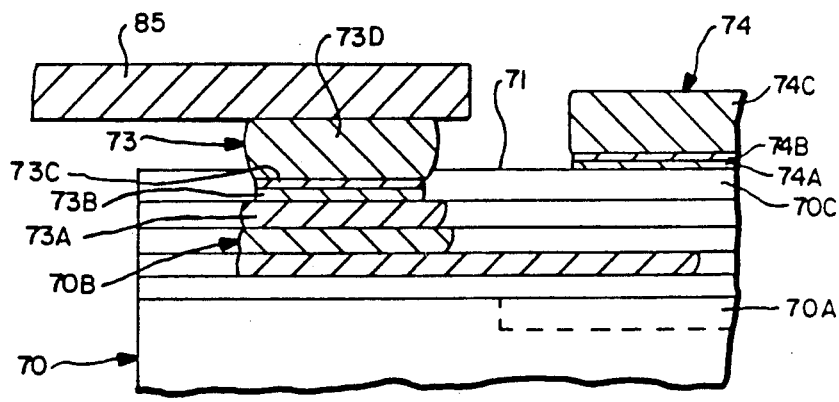
FIG.—6
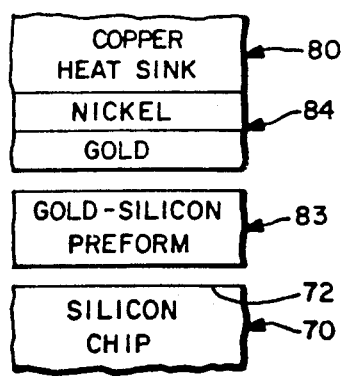
FIG.—11
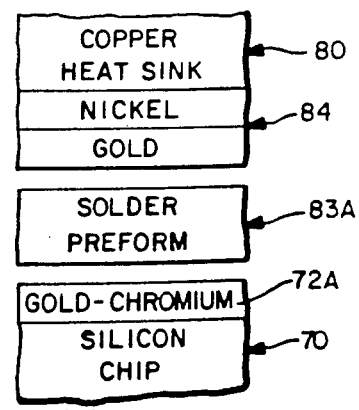
FIG.—12

INTEGRATED CIRCUIT PACKAGING SYSTEMS WITH DOUBLE SURFACE HEAT DISSIPATION

This is a continuation of Ser. No. 368,957, filed Apr. 16, 1982, abandoned.

This invention relates generally to integrated circuit packaging systems and, more specifically, to integrated circuit packaging systems which utilize encapsulated integrated circuit chips mounted directly on a printed circuit substrate.

It has been known for some time that integrated circuit (IC) chips may be packaged inexpensively by mounting the chips directly to a printed circuit substrate using one of several approaches for supporting the chip on the substrate and making electrical connections between the chip and contact pads on the substrate. Thereafter the IC chip and the electrical contact arrangement are encapsulated on the substrate using a silicone potting compound.

FIGS. 1 and 2 of the drawings of this application show alternative prior art approaches to mounting an IC chip on a printed wire substrate. In FIG. 1 the IC chip 10 is mounted in an inverted fashion on the substrate 20 using a beam lead solder approach. An electrical connection arrangement 15 connects individual bumped bonding pad regions 11 on the chip 10 to corresponding bonding pad elements 21 on the substrate 20. A heat sink 25 is mounted on the back surface 12 of chip 10, typically by forming a gold-silicon eutectic bond 26 between the heat sink 25 and the chip 10. A silicon potting compound 30 may then be molded over the chip 10 and conductor arrangement 15 to encapsulate the chip and the conductor arrangement of the circuit board 20.

An alternative approach using the prior art is depicted in FIG. 2. In this case the IC chip 35 is mounted face up on the printed circuit substrate 40 and a wire or beam tape bonding arrangement 45 is utilized to connect the bonding pads 36 on chip 35 to corresponding bonding pads 41 on printed circuit substrate 40. Utilizing this approach a chip mounting pad 42 is usually provided on the printed circuit substrate 40 and a gold-silicon eutectic bond 43 is formed between chip 35 and the chip mounting pad 42. A volume of silicone potting compound 50 is then molded over the entire mounted chip 35 and connecting wire arrangement 45 to encapsulate it.

In the prior art arrangement of FIG. 1, heat generated in the chip 10 is dissipated generally by conduction through to the back surface 12 of the chip and into the heat sink 25. A variation of this prior art mounting arrangement shown in FIG. 1 is taught for example in Ritchie et al. U.S. Pat. No. 4,278,991. In the prior art arrangement shown in FIG. 2 the heat generated in the chip 35 is principally dissipated through the back surfrace 37 of the chip into the printed circuit substrate 40.

As IC devices have grown in size with higher and higher levels of device integration on each chip, power consumption by the chip has increased substantially, which in turn creates the need for packaging arrangements which can conduct away sufficient amounts of the power dissipated in the chip to maintain sufficiently low device junction temperatures to achieve reliable, long-life circuit operation. In general, most of the heat generated in an IC chip is carried to the package's outer surface by conduction rather than convection or radiation. This is especially true for large size chips with high power dissipation requirements. The solid contact area size, i.e. the size of the area in contact with a heat dissipating heat sink is very significant in determining the temperature rise of the junctions of the circuit elements in the chip.

According to reliability studies, it has been determined that lowering the device junction temperatures by approximately fifteen degrees with effective heat dissipating heat sink arrangements will increase the life of an IC device by approximately one hundred percent. While the heat sink arrangements in the prior art packaging structures of FIGS. 1 and 2 of the drawings may be sufficient for certain low power low integration level IC devices, these arrangements will not provide sufficient heat dissipation for high power IC chips having a high level of device integration thereon. Some fairly high density bipolar IC chips may have a total power dissipation requirement of as much as 1.5 watts. As higher densities of bipolar IC chips are achieved, power dissipation requirements may rise as high as 3 watts or more per chip. Further as higher and higer densities of MOS IC devices are being designed, power dissipation in MOS chips is also becoming a problem. For high power consumption IC chips, the chip mounting and heat sinking arrangements depicted in FIGS. 1 and 2 do not have sufficient power dissipation capability to maintain device junction temperatures at a sufficiently low level for reliable long-life operation.

Accordingly, it is a principal object of this invention to provide an improved mounting and heat sinking arrangement for semiconductor integrated circuit chips.

It is a further object of this invention to provide an integrated circuit chip mounting arrangement which proves the reliability of operation of the chip by effective heat dissipation from both top and bottom surfaces of the chip.

In accordance with one aspect of this invention, the above-stated objects are achieved in a mounting arrangement for a semiconductor chip having bottom surface and a top surface with an integrated circuit fashioned thereon, including a plurality of bonding pads disposed around the periphery of the top surface. A first heat sink is provided having a mounting surface corresponding substantially to the area of the bottom surface of the chip. First means are provided for mounting the mounting surface of the first heat sink to the bottom surface of the chip in good heat transfer relation. A second heat sink having a mounting surface corresponding substantially to the region of the top surface of the chip interior to the bonding pads is provided. Second means are provided for mounting the second heat sink to the top surface of the chip in good heat transfer relation.

Preferably the top surface of the IC chip has a relatively thick layer of electrical insulating material deposited thereon and a layer of gold formed over this oxide layer. The second heat sink is preferably formed of copper and the second mounting means preferably comprises a solder preform formed of a low temperature alloy for bonding the copper heat sink to the gold layer.

To prevent the formation of unwanted intermetallics on the chip, between the layer of gold and the oxide layer there may be formed an adhesion metal layer directly on the oxide layer and a diffusion barrier metal layer on the adhesion metal layer. The combination of adhesion and diffusion layers may comprise chrome and copper, titanium and palladium, titanium and platinum, or platinum and tungsten.

For mounting the first heat sink to the back surface of the integrated circuit chip, it is preferable to form a layer of gold on the surface of the heat sink. The first mounting means for mounting that heat sink to the surface of the silicon integrated circuit chip may then comprise a gold-silicon preform for forming a gold-silicon eutectic bond between the heat sink and the chip. Alternatively, a layer of gold-chromium alloy may be formed on the bottom surface of the chip and a solder preform formed of a low temperature alloy may be employed for bonding the gold layer on the first heat sink to the gold-chrome alloy layer on the chip.

The mounting arrangement in accordance with this invention may utilize a substrate having a bonding pad and circuit lead arrangement formed on a top surface thereof. The semiconductor chip may be mounted on the top surface of the substrate using means which mounts the chip in an inverted orientation and connects the chip to bonding pads on the substrate. Using this approach the top surface of the chip is separated from the top surface of the substrate by a prearranged separation distance. Preferably the top surface of the substrate has a heat sink mounting pad thereon and the second heat sink which is mounted to the top surface of the chip has a thickness substantially corresponding to the separation distance. Third means are then provided for mounting the second heat sink to the heat sink mounting pad on the substrate in good heat transfer relation. Using this inverted chip mounting arrangement the first heat sink is a separate heat sink mounted to the back surface of the chip and extending away from the printed circuit substrate.

In an alternative arrangement the first heat sink may comprise the substrate with a chip mounting pad formed thereon in addition to the bonding pad and circuit arrangement for making connections to the IC chip. In this case the second heat sink is mounted to the top surface of the chip and extends outwardly from the printed circuit substrate.

Utilizing either of these mounting arrangements, encapsulating means may be formed on the substrate to encapsulate the chip with the encapsulating means covering only a portion of the outer one of the heat sinks. To enhance heat transfer from the heat sink into an ambient cooling air stream, a first heat sink body having a cross sectional area substantially corresponding to the associated mounting area on the semiconductor chip may be utilized for ease of encapsulation of the overall arrangement and a second heat sink body may be provided having a larger cross sectional area and being mounted to the first heat sink body above the volume of encapsulating means.

The use of the double surface heat sink mounting approach of this invention provides the advantage of reducing the device junction temperature, thus improving the reliability and life of the integrated circuit device. Adding metal layers on top of the oxide insulation layer formed on the top surface of the chip makes it possible to mount a heat sink directly on the top surface of the chip but insulated from the chip circuitry. This results in a substantial increase in the heat conduction area which will result in a substantial lowering of the juncture temperature of the device and an overall increase in device reliability.

Other objects, features, and advantages of this invention will be apparent from a consideration of the following detailed description taken in conjunction with the accompanying drawings.

FIG. 1 is a schematic, partly sectioned elevational view of a prior art integrated circuit chip mounting arrangement.

FIG. 2 is a schematic, partly sectional elevational view of a prior art arrangement for mounting an integrated circuit chip.

FIG. 3 is a partly sectioned, elevational view of one embodiment of an IC chip mounting arrangement in accordance with this invention.

FIG. 4 is a partly sectioned, elevational view of an alternative embodiment of an IC chip mounting arrangement in accordance with this invention.

FIG. 5 is a top plan view of a semiconductor chip illustrating a portion of a mounting arrangement in accordance with this invention.

FIG. 6 is a fragmented, partly sectioned, elevational view taken along the lines 6—6 in FIG. 5.

FIGS. 7-12 illustrate various aspects of heat sink mounting arrangements as part of an IC mounting arrangement in accordance with this invention.

The prior art arrangements for mounting an IC chip on a printed wire substrate depicted in FIGS. 1 and 2 have already been described in the introductory section of this specification and that description need not be repeated here.

FIG. 3 illustrates one IC chip mounting arrangement in accordance with this invention in which the IC chip 70 is mounted in inverted fashion on a printed wire substrate 60 with a heat sink arrangement 80 mounted to a back surface 72 of IC chip 70 and a heat sink 63 mounted to a region of the front surface 71 of IC chip 70. The heat sink 63 is in turn bonded to a mounting pad 63 on the printed wire substrate 60. FIG. 4 shows another IC chip mounting arrangement in accordance with this invention in which the IC chip 100 has its back surface 102 bonded with a mounting pad 93 on a printed wire substrate 90 so that the chip bonding pad 93 and the wire substrate 90 serve as a heat sink for the semiconductor chip. Another heat sink 110 is bonded to the top surface 101 of the chip 100 to provide additional cooling. The common aspects of the various embodiments of an IC chip mounting arrangement in accordance with this invention are thus to provide a first heat sink which has a mounting surface corresponding substantially to the area of the bottom surface of the chip. In the FIG. 3 embodiment this first heat sink is the heat sink 80, and in the FIG. 4 embodiment this first heat sink is the chip mounting pad 93 and the substrate 90. First means are provided for mounting the mounting surface of the first heat sink to the bottom surface of the chip in good heat transfer relation. In the FIG. 3 embodiment this mounting means constitutes the bonding layer 75, and in the FIG. 4 embodiment this mounting means constitutes the bonding layer 113.

In accordance with this invention a second heat sink is provided having a mounting surface corresponding substantially to a region of the top surface of the chip interior to the bonding pads on that top surface. In the FIG. 3 embodiment this constitutes the heat sink 75 whose top surface constitutes a mounting surface and corresponds substantially to an interior region of the top surface 71, i.e. interior to the region in which the bonding pads 73 are disposed. In the FIG. 4 embodiment the second heat sink is the heat sink 110 which is bonded to the region of the top surface 101 of chip 100 interior to the bonding pads 103. In accordance with this invention a second means is provided for mounting this second heat sink to the top surface of the chip in good heat transfer relation. In the FIG. 3 embodiment this mounting means constitutes the bonding layer 77. In the FIG. 4 embodiment this second mounting means constitutes the bonding layer 113. The specific details of these bonding layers will be described later.

Referring now to FIGS. 3, 5 and 6 together, it is seen that the top surface 71 of the IC chip 70 has an array of bonding pads 73 disposed around a peripheral region of that surface. In this particular instance the bonding pad arrangement 73 is a bumped bonding pad arrangement as shown in cross section in FIG. 6. The actual bonding pad of the IC chip 70 is the metal layer 73A which is the top metal layer of a multilevel metal conductor arrangement 70B formed on the chip 70. The bonding pad region 70B is used to connect bias and signal voltages to and from the chip 70, i.e. to circuit portions of chip 70 generally formed in the region 70A. No attempt has been shown in FIG. 6 to depict actual integrated circuit structures since such structures are not within the purview of this invention and are well-known to persons of skill in the integrated circuit art. The heat dissipated in IC chip 70 is primarily generated in the circuit structure region 70A of the chip substrate and in any resistive structures built on top of the surface of the substrate of the chip.

The top layer 70C on chip 70 represents a passivation layer through which bonding pad windows or bias 71A are formed to expose the chip bonding pad 73A for making electrical connection to external circuit elements. The bumped bonding pad arrangements 73 together with the connecting lead element 85 which may form part of a lead frame arrangement or a beam-tape bonding arrangement together form one way of making connections to the bonding pad element 73A of the chip 70. The bumped bonding pad and beam lead tape bonding arrangement is discussed in detail in an article entitled "The Status of Tape-Automated Bonding" published in the February, 1981 issue of *SEMICONDUCTOR INTERNATIONAL*, pages 33–51.

This invention is not limited to use of the bumped bonding pad beam lead tape connection arrangement but may be used with any chip connecting arrangement, such as the standard wire bonding arrangement used in the prior art. However, this invention is particularly well-adapted to use of the bumped bonding pad approach since the heat sink mounting pad 74 formed on the top surface 71 of chip 70 may conveniently be formed at the same time that the time bumped bonding pad arrangement is formed. In accordance with a preferred form of this invention, the concurrent formation of the bumped bonding pad and the heat sink mounting pad 74 is accomplished by first forming an adhesion metal layer 73B over the chip bonding pad 73A while simultaneously forming an adhesion metal layer 74A over the interior region of the passivation layer 70C. Next a barrier metal layer 73C is formed over the adhesion layer 73B and the bonding pad region while simultaneously forming the same metal layer 74B in the heat sink mounting region over passivation layer 70C. However, this barrier layer could be eliminated in the structure of the heat sink bonding pad 74 since its principal function in connection with the chip bonding pad 73A is to prevent the formation of unwanted intermetallics between the aluminum bonding pad 73A and the gold bump layer 73D. Finally a layer of gold is electroplated on the wafer forming the bumped region 73D and simultaneously forming the gold layer 74C of the heat sink bonding pad 74. The adhesion metal layer and the barrier metal layer may comprise any of the following respective combinations: chromium and copper, titanium and palladium, and titanium and platinum. The beam lead 85 is generally formed of gold-plated copper for assuring a high reliability, low resistance contact between the gold bump 73D and the beam lead 85.

Referring back to FIG. 3, it is seen that the individual beam leads 85 are utilized to mount the chip 70 in inverted fashion on substrate 60 and to connect the bumped bonding pad 73 to corresponding printed circuit mounting pads 62 on the top surface 61 of substrate 60. A thermocompression gold-tin eutectic bond is usually formed between the beam lead 85 and the bonding pad bump 73D and thermocompression or solder bonding is also generally utilized for bonding the beam leads 85 to the mounting pads 62 on the substrate 60.

Substrate 60 is preferably a ceramic substrate having a printed wire circuit arrangement formed on the top surface 61 including the chip mounting pads 62. Usually a plurality of IC chips will be mounted on the top surface 61 of the substrate 60. The substrate 60 may be a single level substrate having a single printed circuit arrangement on one surface thereof, or it may be a single substrate having circuit connections on both top and bottom surfaces thereof or it may comprise a multilevel substrate having a plurality of printed circuit layers.

Prior to mounting IC chip 70 on substrate 60, the heat sink 75 is first positioned on the heat sink mounting pad 63 and appropriate heat sink bonding means are provided for bonding heat sink 75 to the metal layer 74 on chip 70 and the heat sink mounting pad 63 on substrate 60. With the heat sink 75 in position together with the bonding means, the leads 85 may be bonded to the mounting pad 62 on the substrate 60. Thereafter the central body portion 81 of the heat sink 80 may be positioned on the back surface 72 of chip 70 together with the mounting or bonding means 83. Generally, in each instance, the bonding means will be some type of a preform such that, with application of heat and pressure to the assembly, the bonding of heat sink body 81 to chip 70 and heat sink body 75 both to chip 70 and substrate 60 will be completed.

Heat sink 80 is preferably formed in two sections or bodies 81 and 82. The first body 81 has a cross sectional area (which may be either round or rectangular) generally corresponding to the cross sectional area of the chip 70. This permits the chip 70 to be encapsulated on the substrate 70 using an encapsulating material 86. Leaving the outer body 82 of the heat sink 80 off during the encapsulation process makes it easier to mold the encapsulation material around the chip 70. Thereafter, the outer heat sink body 82 may be mounted over the central heat sink body 81 to complete the overall heat sink assembly 80.

As shown in FIG. 7, heat sink 75 is preferably a copper heat sink, and this copper heat sink is preferably bonded to the gold layer on chip 70 using a solder preform 77 formed of a low temperature alloy such as indium-tin. This bonding approach provided a good conductive-type heat transfer relation between the top surface of chip 70 and the heat sink 75.

As shown in FIG. 8 the copper heat sink 75 is preferably bonded to the ceramic substrate 60 using a solder preform 76 which may comprise the same low temperature alloy material mentioned above. Preferably, heat sink mounting pad 63 on substrate 60 includes a top layer of gold. The intermediate layers of nickel and tungsten assist in bonding the gold layer to the top surface of the substrate to form a metallurgically sound and reliable mounting pad. This forms a bonding arrangement with good heat transfer relation between the copper heat sink 75 and the ceramic substrate 60. Accordingly, a large portion of the heat generated by IC chip 70 will be conducted to the copper heat sink 75 and through that heat sink and the intervening bonding layers into the ceramic substrate 60.

As shown in FIGS. 11 and 12 two alternative methods may be employed for bonding the central heat sink body 81 of the heat sink 80 to the top surface 71 of chip 70. FIG. 11 illustrates the use of a gold-silicon preform together with a gold layer formed on the heat sink 80 as part of a gold-silicon preform together with a gold layer formed on the heat sink 80 as a part of a gold-silicon eutectic bonding arrangement. The gold layer on the heat sink 80 is preferably formed over a layer of nickel for purposes of assuring good adhesion to the heat sink. With the gold-silicon preform 83 in position, the combination of applying pressure and heating the assembly to the gold-silicon eutectic temperature causes the formation of a mechanically sound and good heat transfer bonding arrangement between the IC chip 70 and the copper heat sink 80. As shown in FIG. 12 an alternative approach involves the formation of a gold-chromium alloy layer 72A on chip 70 and the use of a low-temperature alloy solder preform 83A to bond the gold-chromium layer 72A on chip 70 to a gold layer formed on heat sink 80.

Referring now to the alternative embodiment of this invention depicted in FIG. 4, in this case the IC chip 100 is mounted directly to a chip mounting pad 93 on substrate 90 and the bumped bonding pads 103 on chip 100 are connected to corresponding bonding pads 92 on substrate 90. Again, thermocompression or gold-tin eutectic bonding of the beam lead elements 106 may be employed in each instance for bonding leads to the bumped bonding pad 103 and to the substrate bonding pads 92. The mounting of the back surface 102 of chip 100 to the chip mounting pad 93 shown in FIG. 4 may be accomplished in either the alternative manners depicted in FIGS. 9 and 10. As shown in FIG. 9, the chip bonding pad 93 on substrate 90 may comprise a sandwich layer of gold, nickel and tungsten formed on the top surface 91 of substrate 90. A gold-silicon preform 105 may be employed to bond the chip 100 to the gold layer of the chip mounting pad 93, forming a gold-silicon eutectic bond by applying sufficient heat to the components and pressure between the chip 100 and the substrate 90. The alternative approach depicted in FIG. 10 is to form a gold chromium alloy layer 102A on the bottom surface 102 of chip 100 and to use a low-temperature alloy solder preform 105A to bond the gold chromium alloy to the gold layer of the chip mounting pad 93. Pressure and heat are also employed in this arrangement to form the bond.

The central heat sink body 111 of heat sink 110 may be bonded to the metal layer 104 on the top surface 102 of chip 100 using the approach depicted in FIG. 7. After the heat sink 111 has been bonded to the chip 100 and the chip 100 in turn bonded to the chip mounting pad 93, the beam lead bonding operation is typically performed next, followed by the molding of the encapsulating material 107 over the entire chip assembly including the lower portion of the central heat sink body 111. Thereafter, the outer heat sink body 112 may be mounted over the central heat sink body 111 to complete the assembly of heat sink 110.

It should be appreciated that the double-sided heat sink arrangement of this invention provides for maximum transfer of heat from the IC chip to external heat sinks which in turn conduct the heat away from the chip and into the substrate or a surrounding cooling fluid. This enables the IC chip to operate at substantially lower junction temperatures increasing both the reliability of chip operation and the operating life of the chip.

While several alternative embodiments of this invention have been disclosed, it should be understood that persons skilled in the art could make numerous modifications without departing from the scope of this invention as claimed in the following claims.

What is claimed is:

1. A mounting arrangement for a semiconductor chip having a bottom surface and a top surface with an integrated circuit fashioned thereon, including a plurality of bonding pads disposed around the periphery of said top surface, comprising:
    (a) a first heat sink having a mounting surface corresponding substantially to the area of said bottom surface of said chip;
    (b) first means for mounting said mounting surface of said first heat sink to said bottom surface of said chip in good heat transfer relation;
    (c) a second heat sink having a mounting surface corresponding substantially to a region of said top surface of said chip interior to said bonding pads;
    (d) second means for mounting said second heat sink to said top surface of said chip in good heat transfer relation wherein said top surface of said chip has a passivation layer of electrical insulating material deposited thereon and a layer of gold formed over a portion of said passivation layer interior to said bonding pads to provide a mounting pad for said second heat sink and wherein said second mounting means includes a solder preform formed of a low temperature alloy for bonding said second heat sink to said mounting pad.

2. The integrated circuit chip mounting arrangement of claim 1, wherein between said layer of gold and said passivation layer are formed an adhesion metal layer on said passivation layer and a diffusion barrier metal layer on said adhesion metal layer, wherein said gold layer is formed on said diffusion barrier metal layer said adhesion and diffusion layers including, respectively, chrome and copper, titanium and palladium, titanium and platinum or platinum and tungsten.

3. The integrated circuit chip mounting arrangement of claim 1, wherein said mounting surface of said first heat sink has a layer of gold formed thereon and said first mounting means comprises one of a gold-silicon preform for forming a gold-silicon eutectic bond between said heat sink and said chip or a layer of gold-chromium alloy formed on said bottom surface of said chip together with a solder preform formed of a low temperature alloy for bonding said gold layer on said first heat sink to said gold-chromium alloy layer on said chip.

4. The mounting arrangement of any of claims 1, 2 or 3, further comprising:
    (a) a substrate having a bonding pad and circuit lead arrangement formed on a substantially planar top surface thereof; means for mounting said semiconductor chip on said top surface of said substrate in an inverted orientation, said top surface of said chip being separated from said top surface of said substrate by a prearranged separation distance, said top surface of said substrate having a heat sink mounting pad thereon, said second heat sink having a thickness substantially corresponding to said separation distance; and (b) third means for mounting said second heat sink to said heat sink mounting pad in good heat transfer relation.

5. The mounting arrangement of claim 4, wherein said top surface of said heat sink bonding pad is a layer of gold and said third mounting means comprises a solder perform formed of a low temperature alloy for bonding said second heat sink to said gold layer on said heat sink bonding pad.

6. The mounting arrangement of claim 4, further comprising encapsulating means formed on said substrate over at least a portion of said chip, said first heat sink including a first heat sink body having a cross-sectional area substantially corresponding to said bottom surface of said semiconductor chip and a second heat sink body having a larger cross-sectional area mounted to said first heat sink body.

7. The mounting arrangement of any of claims 1, 2 or 3 wherein said first heat sink comprises a substrate having a bonding pad and circuit lead arrangement formed on the top surface thereof and a chip mounting pad formed on said top surface to define said first heat sink mounting surface.

8. The mounting arrangement of claim 7, further comprising encapsulating means formed on said substrate over said chip and a lower portion of said second heat sink, said second heat sink including a first heat sink body having a cross-sectional area substantially corresponding to the associated area of said semiconductor ship to which it is bonded and a second heat sink body having a larger cross-sectional area mounted to said first heat sink body.

9. A mounting arrangement for a semiconductor chip having a bottom surface and a top surface with an integrated circuit fashioned thereon, including a plurality of bonding pads disposed around the periphery of said top surface comprising:

(a) a printed circuit substrate having a substantially planar top surface with a bonding pad and circuit lead arrangement formed thereon;

(b) means for mounting said semiconductor chip on said substrate in an inverted orientation with said top surface of said chip separated from the top surface of said substrate and including means for electrically connecting said chip bonding pads to said bonding pad and circuit lead arrangement of said substrate;

(c) a first heat sink mounted to said bottom surface of said chip; and (d) a second heat sink having a first surface mounted to a portion of said top surface of said chip interior to said bonding pads and a second surface mounted to said top surface of said substrate, wherein said top surface of said chip has a passivation layer of electrical insulating material deposited thereon and a layer formed over a portion of said passivation layer interior to said bonding pads to provide a mounting pad for said second heat sink and wherein said second mounting means includes a low temperature alloy for bonding said second heat sink to said mounting pad.

10. A mounting arrangement for a semiconductor chip having a bottom surface and a top surface with an integrated circuit fashioned thereon comprising:

(a) a printed circuit substrate having a top surface with a chip mounting pad and a bonding pad and circuit arrangement formed thereon;

(b) means for mounting said bottom surface of said semiconductor chip to said chip mounting pad in good heat transfer relation;

(c) means for connecting said bonding pads on said chip to said bonding pad and circuit lead arrangement on said substrate;

(d) a heat sink having a bottom mounting area substantially corresponding to an area of said top surface of said chip interior to said bonding pad; and (e) means for mounting said heat sink to said top surface area of said chip in good heat transfer relation, wherein said top surface of said chip has a passivation layer of electrical insulating material deposited thereon and a layer formed over a portion of said passivation layer interior to said bonding pads to provide a mounting pad for said heat sink.

11. The mounting arrangement of either claim 9 or 10, further comprising encapsulating means formed on said substrate over said chip, said outer heat sink including a first heat sink body having a cross-sectional area substantially corresponding to the associated area of said semiconductor chip to which it is bonded to a second heat sink body having a larger cross-sectional area mounted to said first heat sink body.

12. An article of manufacture for mounting an integrated circuit chip, said chip having a first side with a plurality of bonding pads for bonding of a plurality of leads to said chip and a second side, said article comprising:

(a) a first heat sink having a first mounting surface adapted for bonding to said second side of said chip;

(b) a first mounting means bonding said first mounting surface to said second side of said chip in good heat transfer relation;

(c) a second heat sink having a second mounting surface adapted for bonding to said first side;

(d) second mounting means including a low temperature alloy for bonding said second mounting surface to said first side of said chip in good heat transfer relation;

(e) isolating means for insulating said second mounting means to prevent electrical connection of said chip to said second heat sink; and (f) encapsulating means for encapsulating said chip between said first heat sink and said second heat sink;

(g) said first side of said chip having a passivation layer of electrical insulating material deposited thereon and a layer of gold formed over a portion of said passivation layer interior to said bonding pads to provide a mounting pad for said second heat sink.

13. The article of claim 12, wherein said second mounting surface is adapted to match said first side of said chip so that when bonded by said second mounting means to said chip said second mounting surface avoids contact with said bonding pads or said leads.

14. The article of claim 12, wherein said bonding pads are arranged around an outside peripheral of said first side of said chip and said second mounting surface is adapted for bonding to said first side in an area inside the outside peripheral defined by said bonding pads.

15. The article of claim 12, wherein said isolating means includes a passivation layer formed on said first side of said chip to define a mounting area on said first side to which said second mounting means bonds said second heat sink.

16. A mounting arrangement for a semiconductor chip having a bottom surface and a top surface with an integrated circuit fashioned thereon, including a plurality of bonding pads disposed around the periphery of said top surface, comprising:
  (a) a printed circuit substrate having a substantially planar top surface with a bonding pad and circuit lead arrangement formed thereon;
  (b) means for mounting said semiconductor chip on said substrate in an inverted orientation with said top surface of said chip separated from the top surface of said substrate and including means for electrically connecting said chip bonding pads to said bonding pad and circuit lead arrangement of said substrate;
  (c) a first heat sink mounted to said bottom surface of said chip and a second heat sink having a first surface mounted rigidly to a portion of said top surface of said chip interior to said bonding pads and a second surface mounted rigidly to said top surface of said substrate, wherein said means for electrically connecting said chip bonding pads to said bonding pad and circuit lead arrangement of the substrate comprises a plurality of flexible connecting lead elements extending outwardly from said bonding pads around the periphery of said top surface of said clip and downwardly to said bonding pad and circuit lead arrangement of the substrate; whereby the flexible connecting lead elements allow mounting of said second heat sink on both said first surface and said second surface and wherein said top surface of said chip has a passivation layer of electrical insulating material deposited thereon and a layer of gold formed over a portion of said passivation layer interior to said bonding pads to provide a mounting pad for said second heat sink.

\* \* \* \* \*